(12) United States Patent
Schelmbauer

(10) Patent No.: US 7,138,857 B2
(45) Date of Patent: Nov. 21, 2006

(54) SIGNAL PROCESSING DEVICE FOR MOBILE RADIO

(75) Inventor: Werner Schelmbauer, Linz (AT)

(73) Assignee: Infineon Technologies AG, Munich (DE)

( * ) Notice: Subject to any disclaimer, the term of this patent is extended or adjusted under 35 U.S.C. 154(b) by 78 days.

(21) Appl. No.: 10/950,035

(22) Filed: Sep. 24, 2004

(65) Prior Publication Data
US 2005/0101281 A1 May 12, 2005

(30) Foreign Application Priority Data
Sep. 26, 2003 (DE) ................................ 103 44 876

(51) Int. Cl.
*H03D 3/02* (2006.01)
(52) U.S. Cl. ...................... 329/323; 455/323; 455/313; 329/324; 329/325
(58) Field of Classification Search ................ 455/323, 455/313; 329/323, 324, 325
See application file for complete search history.

(56) References Cited

U.S. PATENT DOCUMENTS

| | | | |
|---|---|---|---|
| 5,548,840 A | | 8/1996 | Heck |
| 5,630,228 A | * | 5/1997 | Mittel ......................... 455/326 |
| 5,901,350 A | * | 5/1999 | Stoichita et al. ............. 455/321 |
| 5,920,810 A | | 7/1999 | Finol et al. |
| 2004/0142674 A1 | * | 7/2004 | Kuiri .......................... 455/334 |

FOREIGN PATENT DOCUMENTS

EP 0 565 299 A1 10/1993

OTHER PUBLICATIONS

"RF Microelectronics", Behzad Razavi, Prentice Hall, 1998, 23 pgs.
"Analysis and Design of Analog Integrated Circuits", Gray, Hurst, Lewis, Meyer, Fourth Edition, John Wikley & Sons, 2001, 25 pgs.

* cited by examiner

*Primary Examiner*—Arnold Kinkead
(74) *Attorney, Agent, or Firm*—Eschweiler & Associates, LLC

(57) ABSTRACT

A signal processing device includes a conversion device configured to output a differential current signal at two taps on the basis of an input signal and an oscillator signal. A respective controllable current source is coupled to one of the two taps. An amplification device having a current signal input has a first connection to the first tap and a second connection coupled to the second tap of the conversion device. The amplification device has two output taps; a first charge store is connected to a connection of the amplification device and to the second tap of the amplification device, and a first resistive load is connected in parallel with said first charge store. A second charge store is connected to the second connection of the amplification device and to the first tap of the amplification device, and a second resistive load is connected in parallel with said second charge store.

15 Claims, 5 Drawing Sheets

SIGNAL PROCESSING DEVICE FOR MOBILE RADIO

REFERENCE TO RELATED APPLICATIONS

This application claims the benefit of the priority date of German application DE 103 44 876.4, filed on Sep. 26, 2003, the contents of which are herein incorporated by reference in their entirety.

FIELD OF THE INVENTION

The invention relates to a signal processing device, particularly for mobile radio.

BACKGROUND OF THE INVENTION

Demodulators, particularly I/Q demodulators, are important switching elements for mobile radio. They generally convert a received radio-frequency signal to an intermediate frequency and output it as a complex signal at the output. In this case, the complex signal has been broken down into an in-phase component I and a quadrature-phase component Q. The two components I and Q are filtered from higher-order signal components (which are produced during conversion) by means of a low-pass filter and are supplied to further signal processing.

FIG. 5 shows an I/Q demodulator of this type having two double-balanced mixers. The two balanced mixers are also referred to as Gilbert mixers. The I/Q demodulator contains two Gilbert mixers, one of which is used to convert the in-phase component I and the other of which is used to convert the quadrature-phase component Q. The demodulator shown here is designed to process differential signals. The radio-frequency signal (in the form of a differential signal RF+ and RF− having two components) is supplied, via the capacitors C2, to the control connections of the transistors T2 in the two Gilbert mixers. The two capacitors C2 are used to decouple the RF path from the bias voltage Vb which is used to set the operating point of the transistors T2. The source/emitter circuits (operating as voltage/current converters) in the transistors T2 have been combined to form a differential amplifier with negative current feedback and are driven in opposite senses by the RF signals.

The output signals from these transistors are each supplied to a Gilbert cell comprising two differential amplifiers which are operated as changeover switches. The local oscillator signal LOI or LOQ is likewise applied in the form of a differential signal to the control connections of the transistors T1 which form the Gilbert cell. The current signal outputs of the two Gilbert mixers in the demodulator 1 are each connected to the potential VDD via a resistor R1. As a result, the resistor is used to convert the current signal, at the current interface of the demodulator, to an output voltage which can be tapped off in the form of a differential voltage signal at the taps OUTI− and OUTI+ and OUTQ− and OUTQ+.

For reasons of linearity, it is usually necessary to implement a passive low-pass filter at the output of the two Gilbert mixers. This filter is simultaneously part of the channel filter. As can be seen in the embodiment in FIG. 5, a capacitor C1 is therefore connected between the two signal paths of each mixer. The capacitor C1, together with the two resistors R1, produces a low-pass filter.

In some narrowband systems, for example in the GSM standard, the first pole point of the low-pass filter must be in the region of some few hundred kHz. In this case, the cut-off frequency results from the resistance and the capacitance.

However, the size of the resistor R1 is limited by the output voltage signal. An excessively large resistance value for the resistor R1, combined with the direct current flowing through the resistor, results in an excessively small voltage at the output OUTI−, OUTI+ and OUTQ−, OUTQ+. Therefore, the resistance value must not be selected to be too large. In addition, since the output resistance of the mixer is also limited by the supply voltage VDD, very large capacitance values of C1 are needed to implement the low-pass filter. However, large capacitance values can be integrated only by using a considerable amount of surface area and thus increase the costs of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention is directed to a signal processing device having a conversion device that enables suitable filtering even with relatively small capacitance values.

In this case, the signal processing device comprises a conversion device having a first signal input, a local oscillator input and at least one first current output. The latter has a first and a second tap for outputting a differential current signal. The conversion device is designed to use the oscillator signal to convert a signal—which is applied to the input—to a differential current signal which can be tapped off at the output. A first controllable current source and a second controllable current source which are respectively coupled to the first and second taps of the conversion device are furthermore provided.

In contrast to the solution of current/voltage conversion using a passive resistor, conversion is carried out according to the invention using an active circuit. To this end, a first amplification device having a current signal input is provided. The current signal input of the first amplification device comprises a first and a second connection. The first connection is coupled to the first tap of the output of the conversion device, and the second connection is coupled to the second tap of the output of the conversion device. The amplification device furthermore has an output having a first and a second tap and is designed to amplify a differential current signal which is applied to the two connections. One connection of a first charge store is connected to the first connection of the first amplification device and the second connection of said first charge store is connected to the second tap of the output of the amplification device. A second charge store is connected to the second connection of the first amplification device and to the first tap of the output of the amplification device. A first and a second resistive load are respectively connected in parallel with the first and second charge stores.

Together with its interconnection of the charge stores and the resistive loads, the amplification device forms a current sink for the differential current signal at the output of the demodulator. The level of the DC component in the differential signal can be controlled using the two controllable current sources. The current sources are set in such a manner that the common-mode potential at the two input connections of the amplification device is identical to the common-mode potential at the two taps of the output of the amplification device. As a result, direct current no longer flows through the two resistive loads. The two resistive loads therefore no longer have an upper limit and their value may be increased arbitrarily. Conversely, this considerably reduces the capacitance value of the charge store and thus reduces the surface area. The filter's pole point formed from the capacitance of the charge store and the value of the resistive load can still be set. In addition, it is possible to achieve a higher mixing gain.

In this case, the amplification device is expediently in the form of a transimpedance amplifier for outputting a differential voltage signal. Transimpedance amplifiers use current signals as the input and generate a voltage signal at their output. Alternatively, the circuit may also be implemented using operational amplifiers having a current input.

In one advantageous development of the invention, the signal processing device has a comparison circuit having a signal input, a reference input and a control output. In this case, the signal input is coupled to the first and second taps of the output of the conversion device. The control output is connected to a control input of the first and second controllable current sources, and the comparison means is designed to compare a signal that is applied to the signal input with a reference signal at the reference input and to output a control signal that is dependent on the comparison to the controllable current source. As a result, the two controllable current sources are driven by the comparison circuit.

The comparison circuit measures the common-mode potential at the output of a Gilbert mixer and compares it with a nominal value. The comparison circuit thus controls the two current sources on the basis of a reference value. The value has preferably been set in such a manner that the common-mode potential resulting from the current control is identical to the common-mode potential at the output of the amplification device.

In this case, it is advantageous if the signal input of the comparison circuit is coupled to the first and second taps of the output of the conversion device via a respective resistive load. As a result, the differential current signal is converted to a common-mode voltage signal and can be compared with the reference value by the comparison circuit directly. In this case, the resistive load is preferably in the form of a resistor.

In another advantageous development of the invention, the first and second connections of the amplification device are coupled to the first and second taps of the output of the conversion device via a passive filter. In this case, the filter comprises a charge store that is connected to the first and second connections of the amplification device. The charge store is thus connected in parallel between the first and second connections. The two connections of the amplification device are preferably connected to the two connections of the charge store via a respective resistor. The resistors and the charge store thus form a low-pass filter. A passive filter of this type is advantageous, in particular, when the frequency-dependent mixing gain rises very sharply at particular frequencies on account of an impedance being increased. The resulting linearity problems can be controlled only with difficulty. The inventive arrangement having a passive filter results in a smoothed impedance profile at the output of the conversion device.

In another refinement of the invention, the conversion device has a second current output having a third and a fourth tap. The third and fourth taps of the second current output are connected to a third and a fourth controllable current source, respectively. The conversion device is designed to output a differential current signal at the second current output. The signal processing device furthermore contains a second amplification device having a current signal input, a third connection of the current signal input being coupled to the third tap of the second current output of the conversion device, and a fourth connection of the current signal input of the second amplification device being coupled to the fourth tap of the second output of the conversion device. The second amplification device likewise contains an output having a third and a fourth tap. In addition, a third charge store and a third parallel-connected resistive load and a fourth charge store and a fourth resistive load (connected in parallel with the fourth charge store) are provided. One connection of the third charge store is connected to the third connection of the second amplification device and the other connection of said third charge store is connected to the fourth tap of the output of the second amplification device. One connection of the fourth charge store is connected to the fourth connection of the second amplification device and the other connection of said fourth charge store is connected to the output of the second amplification device.

In this refinement, the conversion device is advantageously a demodulator which respectively outputs two differential signals. In this case, each of the outputs of the conversion device is connected to the active circuit which carries out current/voltage conversion and acts as a low-pass filter. In this case, it is advantageous if the conversion device comprises two Gilbert mixers.

In one alternative embodiment, the conversion device is in the form of an I/Q demodulator for converting a signal to a complex-value signal (having a first and a second component) using an oscillator signal which comprises a first and a second component. In this refinement, the conversion device thus forms a demodulator which is designed to output a complex-value signal having a first and a second component. In this case, the first component is generally referred to as the in-phase component. The second component is called the quadrature-phase component.

In another advantageous development of the invention, the first connection of the first amplification device is coupled to the third tap of the second amplification device. At the same time, the second connection of the first amplification device is coupled to the fourth tap of the second amplification device, and the first tap of the first amplification device is coupled to the fourth connection of the second amplification device. Finally, the second tap of the first amplification device is also coupled to the third connection of the second amplification device. As a result, the channel filter comprising the amplification device and the charge store is in the form of a polyphase filter. This makes it possible to achieve a different selectivity for positive and negative frequencies during operation. The matching between the in-phase and quadrature-phase component paths is improved, and component fluctuations are compensated for thereby.

In one development of this invention, a switching device in a first operating state is used to couple a connection to the associated tap. In addition, the switching device has a second operating state in which the coupling between the connection and the associated tap has been broken. The switching device therefore connects a connection to the associated tap in one operating state and opens the connection in a second operating state. This is particularly advantageous when the intention is to change over between a normal filter mode without the polyphase filter and the polyphase filter mode. A signal processing device of this type can advantageously be used according to choice.

In another development of the invention, at least one charge store is in the form of a variable-capacitance capacitor. This makes it possible to adjust the filter's cut-off frequency.

BRIEF DESCRIPTION OF THE DRAWINGS

The invention is explained in detail below using exemplary embodiments and with reference to the drawings, in which.

DETAILED DESCRIPTION OF THE INVENTION

Figure 1:
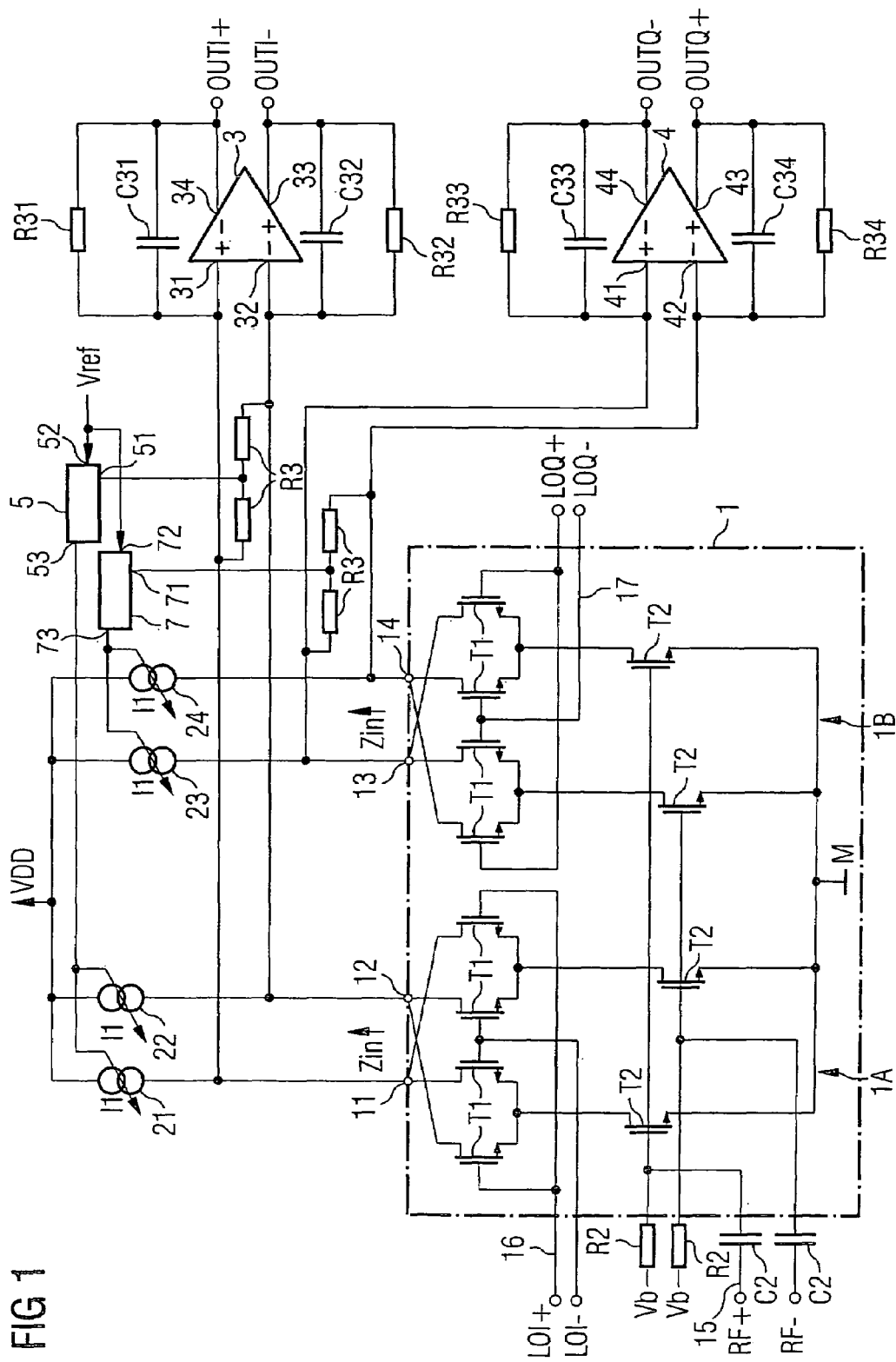
FIG. 1 shows a first exemplary embodiment of the present invention.

FIG. 1 shows one exemplary embodiment of the inventive signal processing device. The latter contains a demodulator 1 having two Gilbert mixers 1A and 1B.

The demodulator 1 has an RF signal input 15 which is designed to process differential signals and carries the two signal elements RF+ and RF−. The connection for the signal element RF+ is connected, via a capacitor C2, to the control connections of a respective field effect transistor T2 in the Gilbert mixers 1A and 1B. The connection for the second signal element RF− is likewise coupled, via a capacitor C2, to the control connection of the other field effect transistor T2 in the mixers 1A and 1B. The two capacitors C2 are used to decouple the radio-frequency path, at the input 15, from the supply voltage Vb, which is likewise applied to the control connections of the transistors T2 via the resistors R2. The voltage Vb is used to set the operating point of the transistors T2 and to set the direct current at the outputs of the Gilbert mixers. The source connection of each transistor T2 is connected to the ground potential M.

The drain connections of the transistors T2 are each connected to a source connection of two further field effect transistors T1. A control connection of one transistor T1 in the Gilbert mixer 1A is connected to the tap of the local oscillator input 16 for the local oscillator signal LOI+, and the control connections of the respective other transistors T1 are connected to the connection for the local oscillator signal LOI−. The Gilbert mixer 1B is connected up in the same manner, only the control connections of the field effect transistors T1 are routed to the local oscillator input 17, to which the oscillator signals LOQ+ and LOQ− are applied.

The respective four field effect transistors T1 in the Gilbert mixers 1A and 1B are also referred to as a Gilbert cell. Two respective drain connections of the four transistors T1 in each Gilbert cell form the output taps 11 and 12 of the first Gilbert mixer 1A in the modulator 1 and the output taps 13 and 14 of the second Gilbert mixer 1B.

The output taps 11 and 12 are each connected to the supply potential VDD via a current source 21 and 22 which can be controlled. The output taps 13 and 14 are likewise also connected to the supply potential VDD via the controllable current sources 23 and 24. The controllable current sources 21 to 24 contain a control signal input which can be used to set the current from the current source and thus also the current through the individual signal paths in the Gilbert mixers. The control signal input of the two current sources 21 and 22 is connected to a control signal output 53 of a control circuit 5. The control circuit 5 also contains a reference input 52 for a reference signal Vref and a signal input 51. The control inputs of the controllable current sources 23 and 24 are also connected to the input 73 of a second control circuit 7. The second control circuit 7 likewise comprises a reference input (for supplying the reference signal Vref) and a signal input 71.

The signal input 51 of the control circuit 5 is connected, via a first resistor R3, to the output tap 11 of the first Gilbert mixer 1A and, via a second resistor R3, to the output tap 12. The signal input 71 of the second control circuit 7 is also connected, via a resistor R3, to the output tap 13 and, via a second resistor R3, to the output tap 14 of the second Gilbert mixer 1B in the demodulator arrangement 1.

The circuit arrangement furthermore contains a first and a second operational amplifier 3 and 4. The two operational amplifiers each have an inverting and a non-inverting input 32, 42 and 31, 41, respectively, and an inverting and a non-inverting output 34, 44 and 33, 43, respectively. The inverting input 32 of the operational amplifier 3 is connected to the output tap 12, and the non-inverting input 31 of the operational amplifier 3 is connected to the output tap 11 of the demodulation arrangement 1. The inverting input 42 of the operational amplifier 4 is connected to the output tap 14, and the non-inverting input 41 of the operational amplifier 4 is connected to the output tap 13. The two operational amplifiers 3 and 4 are in the form of transimpedance amplifiers. They process a current signal at their inputs and output a voltage signal as output signal.

A capacitor C31 and, in parallel with the latter, a resistor R31 are connected in parallel with the non-inverting input 31 and the inverting output 34 of the operational amplifier 3. A respective connection of a capacitor C32 and of a resistor R32 (which is connected in parallel with said capacitor C32) is furthermore connected to the inverting input 32, and the respective other connection of said capacitor and resistor is connected to the non-inverting output 33, of the operational amplifier 3.

The operational amplifier 4 is connected up in a similar manner. In this case too, a respective capacitor C33 is connected in parallel with the non-inverting input 41 and the inverting output 44. A further resistor R33 is likewise in parallel with the capacitor C33. The inverting input 42 is connected to a connection of a second capacitor C34 and of a second resistor R34. The respective other connection of the capacitor C34 and of the resistor R34 is connected to the non-inverting output 43 of the operational amplifier 4. The outputs of the operational amplifiers 3 and 4 furthermore form the signal outputs OUTI+, OUTI− and OUTQ−, OUTQ+ for the entire circuit arrangement.

In contrast to the known solutions in which the current/voltage conversion is effected using a passive resistor, the conversion is carried out in the inventive circuit arrangement using the active circuit 20 comprising the operational amplifiers 3 and 4 and the associated capacitors and resistors.

The differential current signal at the output taps 11, 12 and 13, 14 of each Gilbert mixer 1A and 1B is converted to a common-mode potential using the resistors R3 and is supplied to the signal inputs 51 and 71 of the control circuits 5 and 7. These control circuits constitute a common-mode control circuit and compare the common-mode potential of the two Gilbert mixers 1A and 1B with the reference potential Vref. The current sources 21 to 24 are controlled on the basis of the comparison. If, for example, the signal at the input 51 is smaller than the requisite reference value, the current flow from the current sources 21 and 22 is increased.

The reference signal Vref is set overall in such a manner that the common-mode potential (which results from the differential current signal at the output taps) at the input of the operational amplifiers 3 and 4 is of exactly the same magnitude as the common-mode potential at the output of the operational amplifiers 3 and 4. As a result, no further direct currents flow through the resistors R31, R32, R33 and R34. The values of the resistors may be increased. Since both the resistance value and the capacitor's capacitance are used to determine the filter pole point, the capacitance of the capacitors C31 to C34 can be reduced by increasing the resistance of R31 to R34, without the pole point of the resulting filter shifting. The cut-off frequency of the low-pass filter comprising the capacitors and the resistors is thus maintained.

Figure 2:
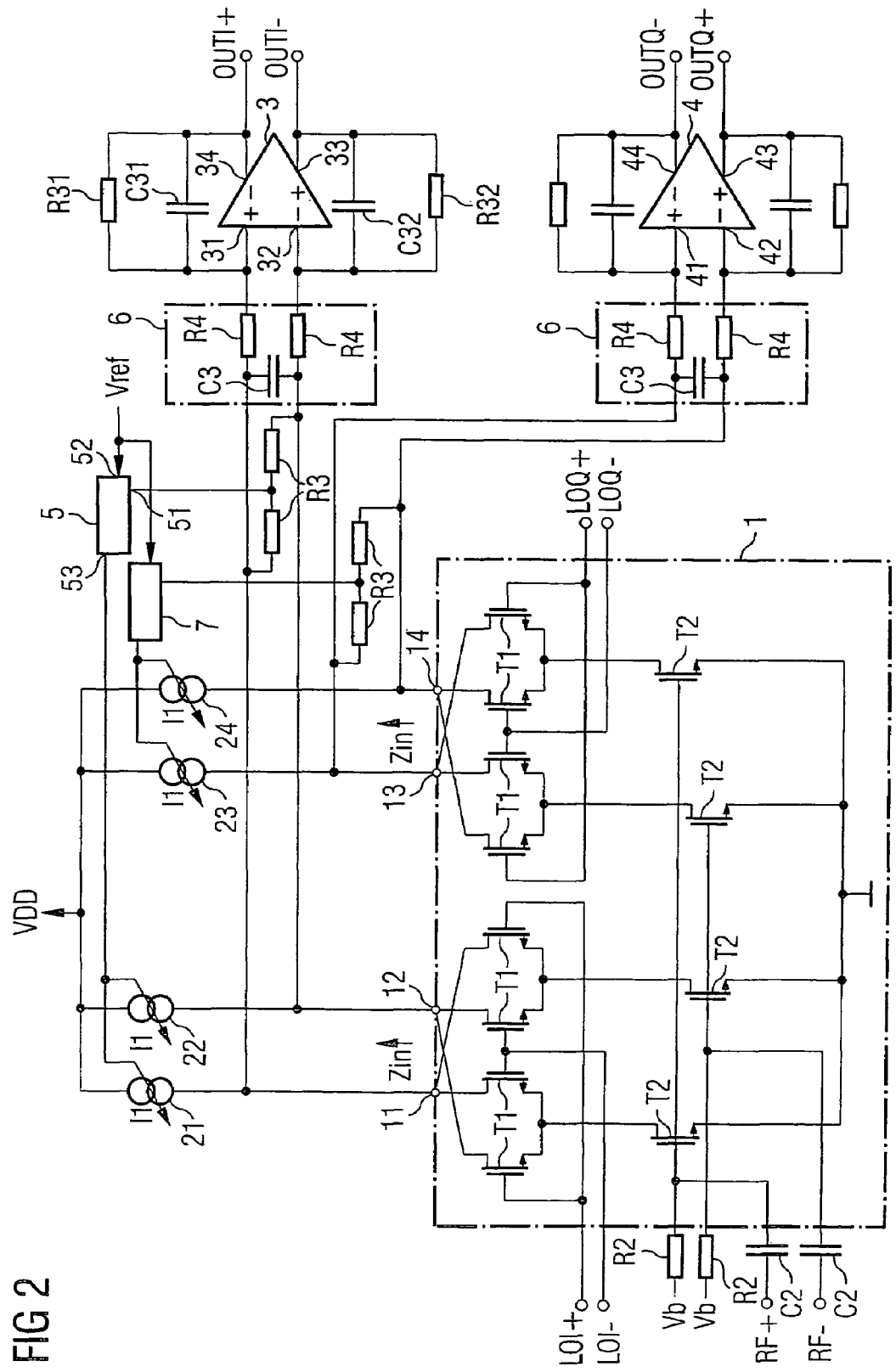
FIG. 2 shows another embodiment of the invention.

FIG. 2 shows a circuit that is similar to the one in FIG. 1 and has been expanded by a passive low-pass filter upstream of the inputs of the operational amplifiers 3 and 4. In this case, corresponding components bear the same reference symbols.

In this case, the low-pass filter 6 has been implemented both in the in-phase signal path I and in the quadrature signal path Q. Each low-pass filter 6 comprises a capacitor C3 which is connected between the two differential signal paths and is thus in parallel with the two inputs 31 and 32 of the operational amplifier 3 or the two inputs 41 and 42 of the operational amplifier 4. In addition, a respective resistor R4 is connected between each connection of the capacitor C3 in the two passive filters and the corresponding inputs of the operational amplifiers 3 and 4. A low-pass filter of this type is required when, in the case of a gain profile of the operational amplifier, the impedance at the output of the Gilbert mixer 1A or 1B is increased. Increasing the impedance increases the mixing impedance at this frequency.

Figure 4:
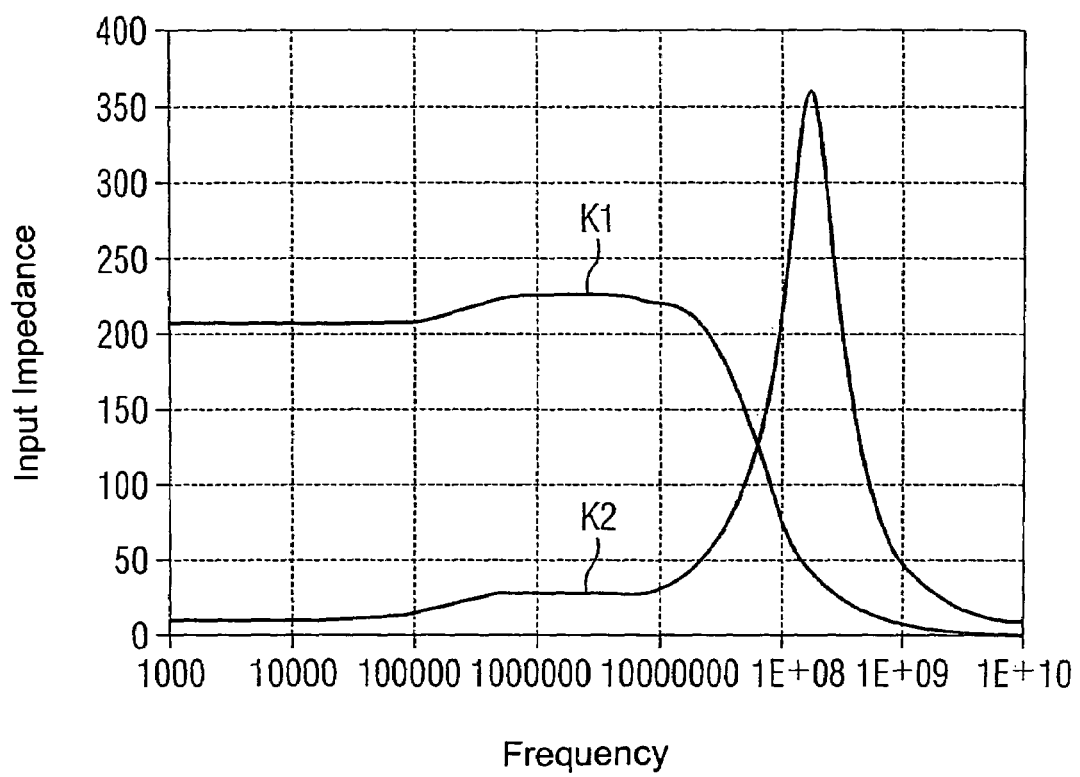
FIG. 4 shows a frequency/impedance graph.
Figure 5:
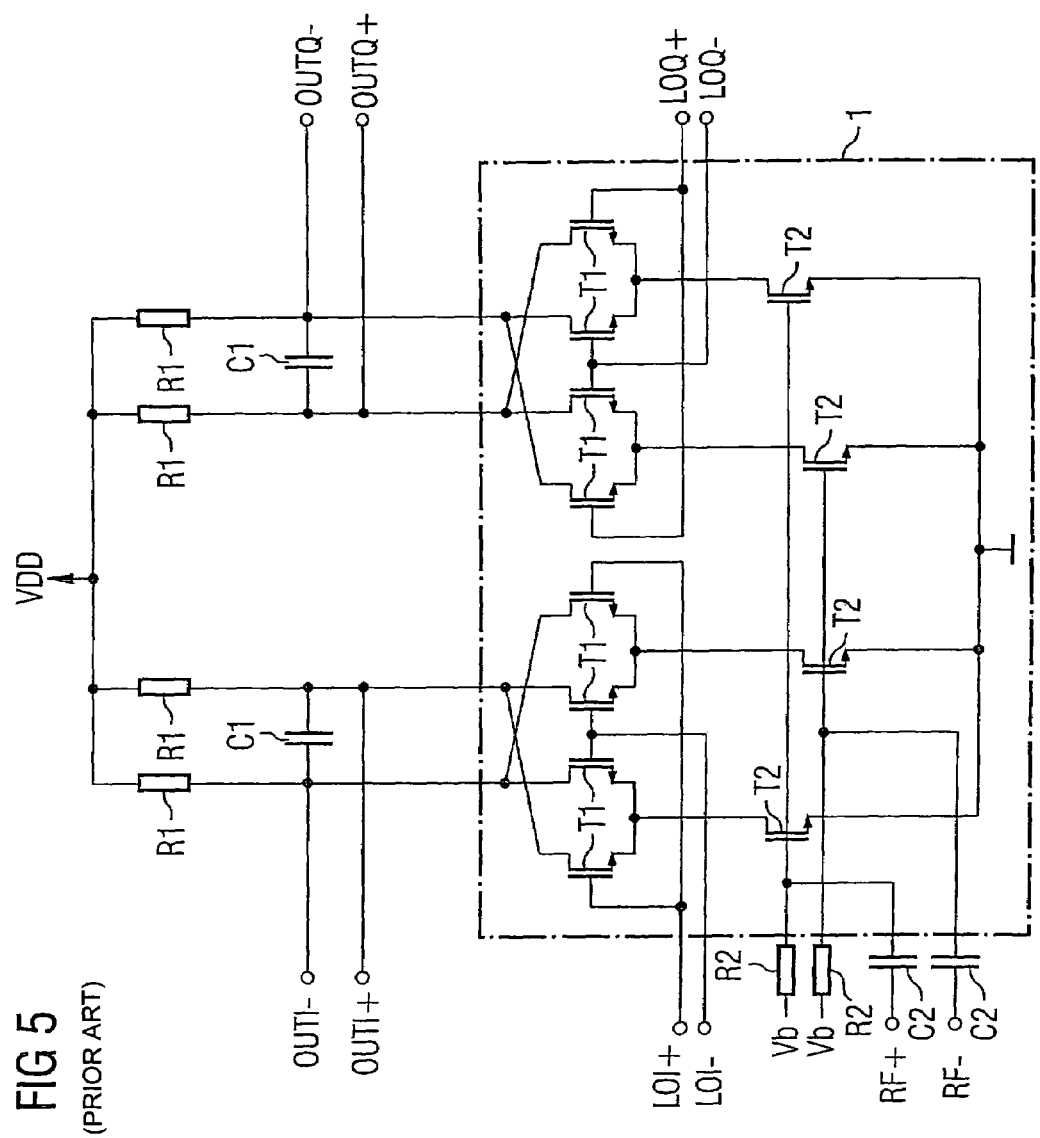
FIG. 5 shows a known prior art arrangement of a demodulator having a passive filter.

FIG. 4 shows a graph depicting the input impedance as a function of the frequency. In this case, curve K2 is the impedance profile without the passive filter 6. Curve K1 shows the impedance profile with a passive filter. It can clearly be seen that the impedance increases considerably at a high frequency without the passive filter. The increase leads to a non-linear gain in the operational amplifiers 3 and 4 and thus to possible errors during further signal processing. The passive filter smoothes the frequency profile shown by curve K1.

Figure 3:
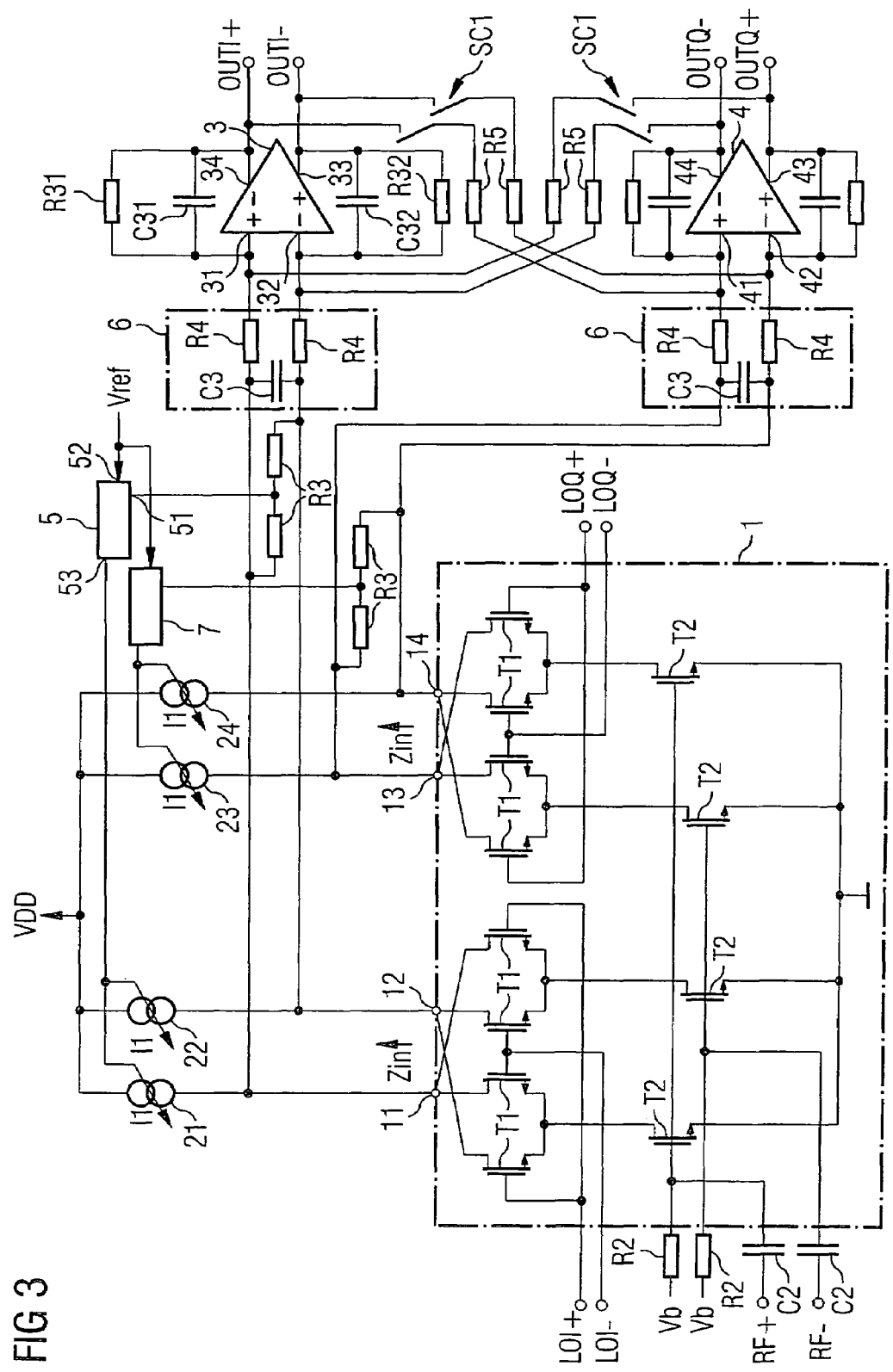
FIG. 3 shows yet another embodiment of the invention.

FIG. 3 shows a further exemplary embodiment of the invention. In this case too, the same reference symbols are used to denote components which are the same. In this embodiment, the operational amplifiers 3 and 4, together with the passive filter and further resistors R5 which are connected between the inputs and outputs of the operational amplifiers, form a polyphase filter.

In this case, the non-inverting input 31 of the operational amplifier 3 is connected, via a first resistor R5 and a switch SC1, to the non-inverting output 43 of the operational amplifier. The inverting input 32 of the operational amplifier 3 is likewise coupled, via a resistor R5 and a switch SC1, to the inverting output 44 of the operational amplifier 4. In contrast thereto, the inverting output 34 of the operational amplifier 3 is connected, via a further switch SC1 and a resistor R5, to the non-inverting input 41 of the operational amplifier 4. The non-inverting output 33 of the operational amplifier 3 is connected, via a further switch SC1 and a resistor R5, to the inverting input 42 of the operational amplifier 4.

This additional design can be used, above all, to implement a low-IF receiver, which requires a polyphase filter for selecting the positive and negative frequencies. In addition, the switches SC1 make it possible to change over between a low-IF receiver and a zero-IF receiver—which does not require any frequency selection—when the switches SC1 are open.

The invention described here is not limited to demodulation arrangements having Gilbert mixers or double-balanced mixers. It is possible to use any type of demodulators or pure mixers which provide a current signal at the output. This current signal is converted to a voltage signal not by a passive filter and a resistor but rather using an active circuit which comprises an amplifier. In this case, the common-mode potential at the input of the amplifier is set by a control circuit using controllable current sources which are connected to the output of the conversion device.

In this case, the control circuit and, in particular, the controllable current sources as well can be implemented using field effect transistors. By way of example, the controllable current source may be implemented using a field effect transistor whose control connection is connected to the control output of the control circuit. The control circuit controls the current through the current source in such a manner that the resulting common-mode potential at the output of the conversion device is identical to the common-mode potential at the output of the amplifier. The amplifier is in the form of a circuit which processes current signals.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

The invention claimed is:

1. A signal processing device, comprising:
    a conversion device comprising a first signal input, a local oscillator input and an output having a first and a second tap configured to output a differential current signal thereat, said conversion device configured to use an oscillator signal received at the local oscillator input to convert an input signal applied to the signal input to the differential current signal provided to the first and second taps comprising the output;
    a first controllable current source coupled to the first tap of the output of the conversion device;
    a second controllable current source coupled to the second tap of the output of the conversion device;
    a first amplification device comprising a current signal input having a first connection coupled to the first tap of the output of the conversion device and a second connection coupled to the second tap of the output of the conversion device, and an output having a first and a second tap, wherein the amplification device is configured to amplify the differential current signal applied to the first and second connections;

wherein the first and second controllable currents sources are configured to control a common mode potential at the first and second connections of the first amplification device;

a first charge store connected to the first connection of the first amplification device and to a second tap of the output of the amplification device, and a first resistive load connected in parallel with said first charge store; and a second charge store connected to the second connection of the first amplification device and to a first tap of the output of the amplification device, and a second resistive load connected in parallel with said second charge store.

2. The signal processing device as claimed in claim 1, wherein the amplification device comprises a transimpedance amplifier configured to output a voltage signal based on the differential current signal.

3. A signal processing device, comprising:
a conversion device comprising a first signal input, a local oscillator input and an output having a first and a second tap configured to output a differential current signal thereat, said conversion device configured to use an oscillator signal received at the local oscillator input to convert an input signal applied to the signal input to the differential current signal provided to the first and second taps comprising the output;
a first controllable current source coupled to the first tap of the output of the conversion device;
a second controllable current source coupled to the second tap of the output of the conversion device;
a first amplification device comprising a current signal input having a first connection coupled to the first tap of the output of the conversion device and a second connection coupled to the second tap of the output of the conversion device, and an output having a first and a second tap, wherein the amplification device is configured to amplify the differential current signal applied to the first and second connections;
a first charge store connected to the first connection of the first amplification device and to a second tap of the output of the amplification device, and a first resistive load connected in parallel with said first charge store; and
a second charge store connected to the second connection of the first amplification device and to a first tap of the output of the amplification device, and a second resistive load connected in parallel with said second charge store; and
a comparison circuit comprising a signal input, a reference input, and a control output, wherein the signal input is coupled to the first and second taps of the output of the conversion device, and the control output is connected to a control input of the first and second controllable current sources, wherein the comparison circuit is configured to compare a signal that is applied to the signal input with a reference signal at the reference input and output a control signal that is dependent on the comparison.

4. The signal processing device as claimed in claim 3, wherein the signal input of the comparison circuit is coupled to the first and second taps of the output of the conversion device via a respective resistive load.

5. The signal processing device as claimed in claim 1, wherein the first and second connections of the amplification device are coupled to the first and second taps of the output of the conversion device via a passive filter, the passive filter comprising a charge store connected to the first and second connections of the amplification device.

6. The signal processing device as claimed in claim 1, wherein the conversion device comprises a second current output having a third and a fourth tap, a third and a fourth controllable current source connected to the third and fourth taps, respectively, wherein the conversion device is configured to output a differential current signal at the second current output, and wherein the signal processing device further comprises:
a second amplification device comprising a current signal input having a third connection coupled to the third tap of the second current output of the conversion device and a fourth connection coupled to the fourth tap of the second current output of the conversion device, and an output having a third and a fourth tap, wherein the second amplification device is configured to amplify a differential current signal that is applied to the third and fourth connections;
a third charge store connected to the third connection of the second amplification device and to the fourth tap of the second output of the second amplification device, and a third resistive load connected in parallel with said third charge store; and
a fourth charge store connected to the fourth connection of the second amplification device and to the third tap of the second output of the second amplification device, and a fourth resistive load connected in parallel with said fourth charge store.

7. The signal processing device as claimed in claim 1, wherein the conversion device comprises at least one Gilbert mixer.

8. The signal processing device as claimed in claim 1, wherein the conversion device comprises an I/Q demodulator configured to convert an input signal to a complex-value signal having a first and a second component using an oscillator signal which also comprises a first and a second component.

9. The signal processing device as claimed in claim 6, wherein the first connection of the first amplification device is coupled to the third tap of the second amplification device, the second connection of the first amplification device is coupled to the fourth tap of the second amplification device, the first tap of the first amplification device is coupled to the fourth connection of the second amplification device, and the second tap of the first amplification device is coupled to the third connection of the second amplification device.

10. The signal processing device as claimed in claim 9, further comprising a switching device configured in a first operating state to couple the first and second connections of the first and second amplification devices to respective first and second taps and provide a decoupling in a second operating state.

11. The signal processing device as claimed in claim 1, wherein at least one of the first and second charge stores comprise a variable-capacitance capacitor.

12. A signal processing device, comprising:
a demodulator configured to convert a radio frequency signal at a differential input to an intermediate frequency signal at a differential output comprising first and second output taps;

a controllable current source circuit including a common-mode control circuit coupled to the differential output of the demodulator, and configured to provide a current to the demodulator, wherein the current is a function of a common mode condition at the differential output of the demodulator; and an active filter coupled to the differential output of the demodulator, and configured to filter out signal components associated with the intermediate frequency signal that are greater than a predetermined frequency.

13. A signal processing device, comprising:

a demodulator configured to convert a radio frequency signal at a differential input to an intermediate frequency signal at a differential output comprising first and second output taps;

a controllable current source circuit coupled to the differential output of the demodulator, and configured to provide a current to the demodulator, wherein the current is a function of a common mode condition at the differential output of the demodulator;

an active filter coupled to the differential output of the demodulator, and configured to filter out signal components associated with the intermediate frequency signal that are greater than a predetermined frequency; and a control circuit coupled between the differential output of the demodulator and the controllable current source circuit, wherein the control circuit is configured to compare the common mode condition with a reference value and output a control signal to the controllable current source circuit, wherein the current associated therewith is adjusted.

14. The signal processing device of claim 13, wherein the active filter comprises:

an amplification circuit; and resistive and capacitive components coupled to the amplification circuit to form a low pass filter.

15. The signal processing device of claim 14, wherein the control circuit is configured to control the controllable current source circuit to match a common mode condition of a differential input and a differential output of the amplification circuit.

* * * * *